US012584969B2

(12) United States Patent (10) Patent No.: US 12,584,969 B2

Ichikawa et al. (45) Date of Patent: Mar. 24, 2026

(54) ESTIMATION DEVICE, ENERGY STORAGE MODULE, ESTIMATION METHOD, AND COMPUTER PROGRAM

(71) Applicant: GS Yuasa International Ltd., Kyoto (JP)

(72) Inventors: Shinnosuke Ichikawa, Kyoto (JP); Shinya Miyazono, Kyoto (JP); Akihito Tanoi, Kyoto (JP); Heisuke Nishikawa, Kyoto (JP); Nobuhiro Nakajima, Kyoto (JP); Takashi Shimizu, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 195 days.

(21) Appl. No.: 18/551,505

(22) PCT Filed: Mar. 9, 2022

(86) PCT No.: PCT/JP2022/010233

§ 371 (c)(1),
(2) Date: Sep. 20, 2023

(87) PCT Pub. No.: WO2022/202318

PCT Pub. Date: Sep. 29, 2022

(65) Prior Publication Data

US 2024/0168099 A1 May 23, 2024

(30) Foreign Application Priority Data

Mar. 26, 2021 (JP) ................................. 2021-053496

(51) Int. Cl.
*G01R 31/3842* (2019.01)
*G01R 31/3828* (2019.01)
(Continued)

(52) U.S. Cl.
CPC ..... *G01R 31/3842* (2019.01); *G01R 31/3828* (2019.01); *H01M 4/483* (2013.01);
(Continued)

(58) Field of Classification Search
None
See application file for complete search history.

(56) References Cited

U.S. PATENT DOCUMENTS

2008/0236909 A1 10/2008 Morita et al.
2013/0300425 A1 11/2013 Shiraishi et al.
(Continued)

FOREIGN PATENT DOCUMENTS

JP 2008-243674 A 10/2008
JP 2014-199238 A 10/2014
(Continued)

OTHER PUBLICATIONS

International Search Report and Written Opinion for International Application No. PCT/JP2022/010233, dated May 24, 2022, (9 pages), Japan Patent Office, Tokyo, Japan.

*Primary Examiner* — Jas A Sanghera
(74) *Attorney, Agent, or Firm* — Buchalter LLP

(57) ABSTRACT

An estimation device is a device that estimates a charge state of an energy storage device including a negative electrode having a negative active material that contains Si. The estimation device includes a control unit that determines based on a charge-discharge history of the energy storage device whether or not to perform a first estimation method of estimating a charge state of the energy storage device by using a relationship between the charge state and a voltage of the energy storage device.

16 Claims, 9 Drawing Sheets

(51) Int. Cl.

| | | |
|---|---|---|
| *H01M 4/48* | (2010.01) |
| *H01M 10/42* | (2006.01) |
| *H01M 10/48* | (2006.01) |
| *H01M 4/02* | (2006.01) |
| *H02J 7/82* | (2026.01) |

(52) U.S. Cl.
CPC ......... *H01M 10/425* (2013.01); *H01M 10/48* (2013.01); *H01M 2004/027* (2013.01); *H02J 7/82* (2026.01)

(56) References Cited

U.S. PATENT DOCUMENTS

| | | |
|---|---|---|
| 2015/0044560 A1 | 2/2015 | Ogino |
| 2016/0190651 A1 | 6/2016 | Inagaki et al. |
| 2016/0259012 A1 | 9/2016 | Sejima et al. |
| 2016/0329738 A1 | 11/2016 | Shiraishi et al. |
| 2018/0248169 A1 | 8/2018 | Ogino |
| 2019/0178948 A1 | 6/2019 | Takahashi |
| 2019/0242948 A1 | 8/2019 | Komatsu et al. |
| 2020/0018798 A1* | 1/2020 | Ukumori .............. G01R 31/367 |
| 2020/0088807 A1 | 3/2020 | Ikeda et al. |
| 2021/0210744 A1 | 7/2021 | Ogino |

FOREIGN PATENT DOCUMENTS

| | | |
|---|---|---|
| JP | 2015-057767 A | 3/2015 |
| JP | 2016-166864 A | 9/2016 |
| JP | 2017-211254 A | 11/2017 |
| JP | 2018-057191 A | 4/2018 |
| JP | 2018-205309 A | 12/2018 |
| JP | 2019-105520 A | 6/2019 |
| JP | 2020-047586 A | 3/2020 |
| WO | WO-2013/183524 A1 | 12/2013 |
| WO | WO-2015/040709 A1 | 3/2015 |

* cited by examiner

100

1

3

22

21

22

2

2

2

2

2

2

ESTIMATION DEVICE, ENERGY STORAGE MODULE, ESTIMATION METHOD, AND COMPUTER PROGRAM

CROSS REFERENCE TO RELATED APPLICATIONS

This application is a National Stage Application, filed under 35 U.S.C. § 371, of International Application No. PCT/JP2022/010233, filed Mar. 9, 2022, which international application claims priority to and the benefit of Japanese Application No. 2021-053496, filed Mar. 26, 2021; the contents of both of which are hereby incorporated by reference in their entirety.

BACKGROUND

Technical Field

The present invention relates to an estimation device for estimating a charge state of an energy storage device, an energy storage module, an estimation method, and a computer program.

Description of Related Art

An energy storage device such as a lithium ion secondary battery that can store electric energy and can supply the energy as a power source when necessary has been in use. The energy storage device has been used in a wide range of fields such as portable equipment, power supply devices, transportation equipment including automobiles and railways, and equipment for industrial use such as aviation industry, space industry, and construction industry.

An energy storage device is required to have a high capacity depending on its application. In view of the above, there has been proposed a lithium ion secondary battery where, as a negative active material, a Si-based material that has a much larger theoretical capacity than a carbon material such as graphite used in general is adopted (see, for example, Patent Document JP-A-2015-57767).

In the use of an energy storage device, it is important to accurately estimate a charge state of the energy storage device. As a method for estimating a charge state of an energy storage device, there has been known an OCV method (referencing a voltage) that decides a charge state based on the correlation (SOC-OCV curve) between a state of charge (SOC) and an open circuit voltage (OCV) of the energy storage device where the SOC and the OCV correspond to each other on a one-to-one basis.

BRIEF SUMMARY

For an energy storage device where a negative active material contains a Si-based material, unlike an energy storage device where a negative active material contains a generally-used carbon-based material, when the same technique that is adopted by the energy storage device where the negative active material that contains a carbon-based material is used, there arises a problem that the accuracy of estimating a charge state of the energy storage device is decreased.

It is an object of the present disclosure to provide an estimation device and the like that can improve the estimation accuracy of a charge state in an energy storage device that includes a negative electrode having a negative active material containing Si.

An estimation device according to an aspect of the present disclosure estimates a charge state of an energy storage device including a negative electrode containing a negative active material that contains Si. The estimation device includes a control unit that determines based on a charge-discharge history of the energy storage device whether or not to perform a first estimation method of estimating a charge state of the energy storage device by using a relationship between the charge state and a voltage of the energy storage device.

According to the present disclosure, it is possible to improve the estimation accuracy of a charge state in an energy storage device that includes a negative electrode having a negative active material that contains Si.

DETAILED DESCRIPTION OF VARIOUS EMBODIMENTS

Figure 1:
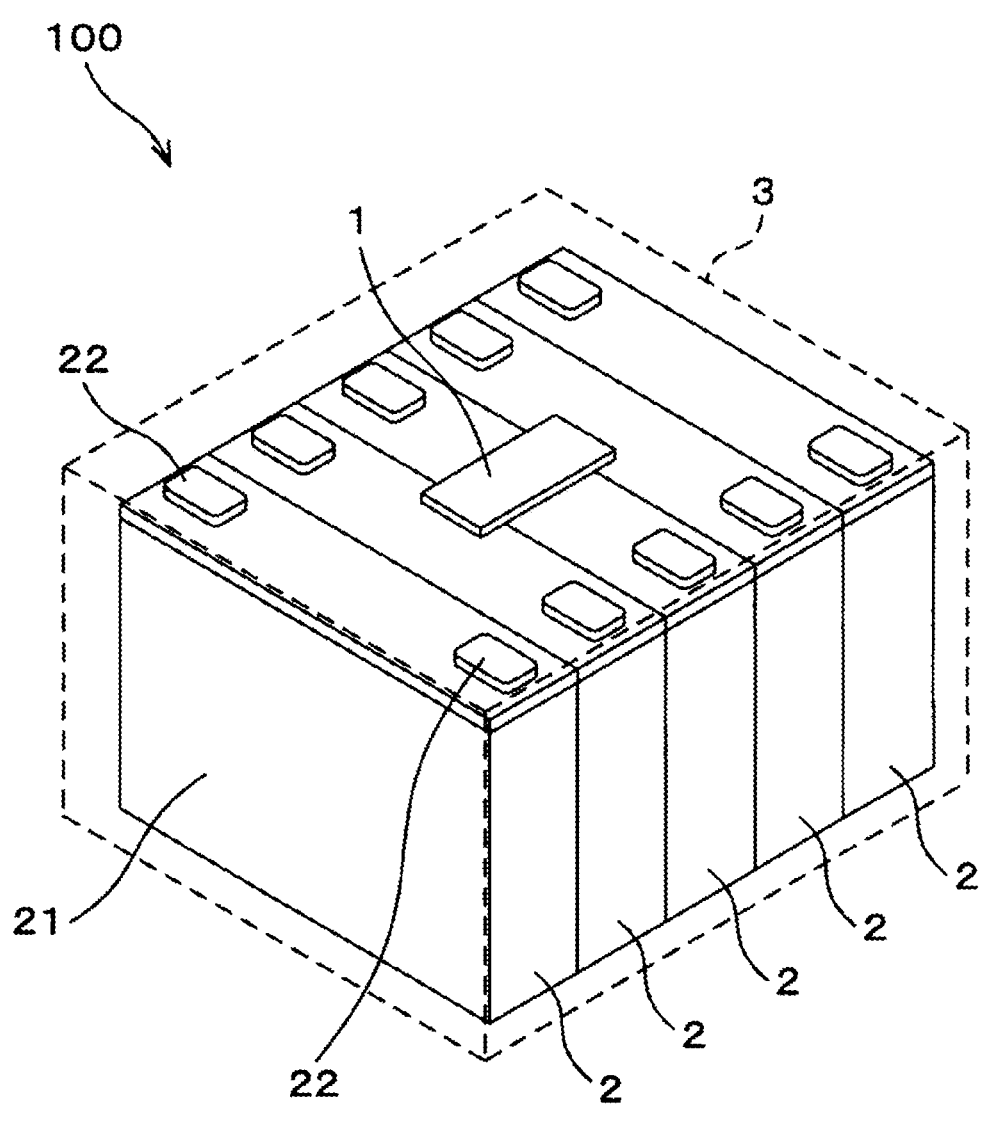
FIG. 1 is a schematic view illustrating a configurational example of an energy storage apparatus on which an estimation device according to a first embodiment is mounted.

An estimation device estimates a charge state of an energy storage device including a negative electrode having a negative active material that contains Si. The estimation device includes a control unit that determines based on a charge-discharge history of the energy storage device whether or not to perform a first estimation method of estimating a charge state of the energy storage device by using a relationship between the charge state and a voltage of the energy storage device.

A control unit of the estimation device determines whether or not to perform the first estimation method based on the charge-discharge history of the energy storage device. The first estimation method may be a method of estimating a charge state of the energy storage device based on a voltage of the energy storage device using the relationship (SOC-OCV curve) between a state of charge (SOC) and an open circuit voltage (OCV) of the energy storage device.

The inventors of the present invention have found out that, in an energy storage device that includes a negative electrode having a negative active material that contains Si, in a case where the energy storage device is charged or discharged under a specific condition (for example, a specific voltage range), a transient potential change is generated in the negative electrode. The transient potential change is a phenomenon where a charge-discharge characteristic of the energy storage device is changed by performing charge or discharge under a specific condition, and a capacity (capacity retention ratio) of the energy storage device is temporarily lowered due to such a change in the charge-discharge characteristic of the energy storage device.

The inventors of the present invention have found out that even when the voltages of the energy storage devices are equal, if the charge-discharge history histories of the energy storage devices up to now are different from each other, there is a possibility that a charge state corresponding to the voltage differs between the energy storage devices. The inventors of the present invention have found out that if a voltage range in charge or discharge differs between the energy storage devices, there is a possibility that a charge state also differs between the energy storage devices. That is, the inventors of the present invention have found out that, in the estimation of a charge state of the energy storage device, it is necessary to take into account information on a path of voltage (voltage range) used by an energy storage device. According to the study made by the inventors of the present invention, a transient potential change is eliminated by performing deep discharge.

According to the configuration described above, the control unit determines whether or not to perform the first estimation method based on a charge-discharge history, that is, by taking into account the voltage range and hence, estimation accuracy is improved.

In the estimation device, the control unit may determine whether or not to perform the first estimation method in accordance with a result of estimation relating to a transient potential change of the negative electrode.

According to the configuration described above, the control unit determines whether or not to perform the first estimation method in accordance with the result of estimation relating to the transient potential change of the negative electrode in the energy storage device. As described above, when the transient potential change of the negative electrode is generated, there is a possibility that the charge state corresponding to the voltage differs. By including the result of estimation relating to the transient potential change of the negative electrode as a factor for determining whether or not to perform the first estimation method, the timing at which the first estimation method is performed is appropriately determined and hence, the decrease in estimation accuracy by the first estimation method is suppressed.

In the estimation device, the control unit may determine to perform the first estimation method in a case where the voltage of the energy storage device is within a range of a voltage threshold where a transient potential change of the negative electrode corresponding to the content of Si in the negative active material is not generated.

With the configuration described above, the control unit determines whether or not the voltage is within a voltage range where a transient potential change of the negative electrode is not generated based on the charge-discharge history and the composition of the negative electrode, and performs the first estimation method in a case where the voltage is within the voltage range where the transient potential change is not generated. In a case where the voltage is within a voltage range in which a transient potential change is generated, there is a high possibility that the charge state is not uniquely decided based on the voltage. By performing the first estimation method only in the voltage range in which a transient potential change is not generated, it is possible to suppress the decrease in estimation accuracy.

In the estimation device, the control unit may determine to perform the first estimation method in a case where discharge that exceeds a deep discharge threshold corresponding to the content of Si in the negative active material is performed in the energy storage device described above.

In the present specification, the deep discharge threshold is a voltage value determined in advance corresponding to the content of Si in the negative active material of the energy storage device, and means a voltage value slightly higher than the lowest voltage value in a dischargeable voltage range (for example, an end-of-discharge voltage).

According to the configuration described above, the control unit performs the first estimation method in a case where the discharge that exceeds the deep discharge threshold is performed in the energy storage device. The transient potential change is eliminated by performing discharge that exceeds the deep discharge threshold (deep discharge). In a case where the voltage of the energy storage device is equal to or lower than the deep discharge threshold, a charge state can be accurately estimated by performing the first estimation method.

In the estimation device, a charge state-voltage profile indicating a relationship between a charge state and a voltage of the energy storage device may include: a first region where the shape of the charge state-voltage profile changes due to a transient potential change of the negative electrode and a second region where the shape of the charge state-voltage profile does not change, and the control unit may estimate the charge state using the charge-state voltage profile in the second region.

The charge state-voltage profile that indicates the relationship between the charge state and the voltage of the energy storage device includes: the first region where the shape of the charge-state voltage profile changes due to a transient potential change of the negative electrode; and the second region where the shape of the charge-state voltage profile does not change. According to the configuration described above, the control unit uses the charge state-voltage profile in the second region where the shape of the charge state-voltage profile does not change, that is, the charge state-voltage profile is not affected by the transient potential change and hence, the accuracy of the estimation by the first estimation method is good.

In the estimation device, in a case where the control unit determines not to perform the first estimation method, the control unit may perform a second estimation method for estimating the charge state of the energy storage device using an integrated value of a current flowing into the energy storage device and/or flowing out from the energy storage device.

According to the configuration described above, in a case where the first estimation method is not performed, that is, in a case where it is estimated that the transient potential change of the negative electrode is generated, the control unit performs the second estimation method for estimating the charge state of the energy storage device by using an integrated value of the current flowing into the energy storage device and/or flowing out from the energy storage device. The second estimation method is an estimation method that is not affected by the presence or absence of a transient potential change of the negative electrode. The control unit improves the estimation accuracy of the charge state by appropriately selectively performing the first estimation method estimation and the second estimation method in accordance with the state of the transient potential change of the negative electrode.

An energy storage module includes energy storage devices and the estimation device described above.

The estimation method is a method for estimating a charge state of an energy storage device that includes a negative electrode having a negative active material that contains Si. The estimation method includes determining based on the charge-discharge history of the energy storage device whether or not to perform the first estimation method of estimating a charge state of the energy storage device by using the relationship between the charge state and the voltage of the energy storage device.

A computer program causes a computer that estimates a charge state of an energy storage device that includes a negative electrode having a negative active material that contains Si to perform processing of determining based on a charge-discharge history of the energy storage device whether or not to perform a first estimation method of estimating the charge state of the energy storage device by using a relationship between the charge state and a voltage of the energy storage device.

Hereinafter, the present disclosure is specifically described with reference to the drawings that illustrate embodiments of the present disclosure.

First Embodiment

FIG. 1 is a schematic view illustrating a configurational example of an energy storage apparatus 100 on which an estimation device 1 according to a first embodiment is mounted. The energy storage apparatus 100 includes the estimation device 1, a plurality of energy storage devices 2, and a holder 3 that accommodates or holds the estimation device 1 and the energy storage devices 2.

The estimation device 1 is a circuit board having a flat plate shape that estimates a charge states of the energy storage devices 2. The estimation device 1 is disposed on upper surfaces of the plurality of energy storage devices 2. The estimation device 1 is connected to the plurality of energy storage devices 2, acquires measurement data including voltages and currents of the energy storage devices 2, and estimate the charge states of the respective energy storage devices 2 based on the acquired measurement data.

Hereinafter, SOCs of the energy storage devices are estimated as charge states. Alternatively, an electricity dischargeable amount may be estimated as a charge state.

In FIG. 1, the estimation device 1 is disposed near the upper surfaces of the energy storage devices 2. Alternatively, the estimation device 1 may be disposed near side surfaces, lower surfaces or the like of the energy storage devices 2. The estimation device 1 may be disposed outside the holder 3. The shape of the estimation device 1 is not limited to a flat plate shape. The estimation device 1 may include: a cell monitoring unit (CMU) and a battery management unit (BMU) that is communicable with the CMU. The estimation device 1 may include, in addition to the CMU and/or BMU, a server device and an electronic control unit (ECU) that are disposed at a place remote from the energy storage devices 2 and are communicable with the CMU or the BMU. The place where the estimation of a charge state of the energy storage devices 2 is not limited and, for example, the estimation may be performed by the BMU or may be performed by the server device or the ECU.

The energy storage device 2 is a battery cell such as a lithium ion secondary battery. The energy storage devices 2 are applicable to, in a state of an assembled battery in which a plurality of energy storage devices 2 are electrically connected to each other, a power source for an automobile such as an electric vehicle (EV), a hybrid electric vehicle (HEV), or a plug-in hybrid electric vehicle (PHEV), a power source for an industrial device such as an aircraft, a space device, or an unmanned submersible instrument, a power source for an electronic device, a power source for power storage, and the like.

FIG. 1 illustrates a single battery module that forms the energy storage apparatus 100. Alternatively, the energy storage apparatus 100 may be a so-called high voltage power source such as an energy storage pack or an energy storage facility that includes a plurality of energy storage modules.

The energy storage device 2 includes: a case 21 having a hollow rectangular parallelepiped shape; and a pair of electrode terminals 22, 22 having different poles that are mounted on one side surface (a terminal surface) of the case 21. The electrode terminals 22 disposed adjacently to each other of the energy storage devices 2 disposed adjacently to each other are connected to bus bars or the like not illustrated in the drawing, and the energy storage device 2 are connected in series. In the case 21, an electrode assembly formed by stacking a positive electrode, a separator and a negative electrode, and an electrolyte (electrolytic solution) are sealed.

The electrode assembly is formed by making the positive electrode having a sheet shape and a negative electrode having a sheet shape overlap with each other by way of two separators having a sheet shape, and by winding these components (vertical winding or lateral winding). The separator is formed of a porous resin film. As the porous resin film, a porous resin film made of a resin such as polyethylene (PE) or polypropylene (PP) or the like can be used.

The positive electrode is an electrode plate where a positive active material layer is formed on a surface of a positive electrode substrate having an elongated strip shape that is made of aluminum, an aluminum alloy or the like, for example. The positive active material layer includes a positive active material. As a positive active material used in the positive active material layer, any suitable known material can be used provided that the positive active material can occlude and release lithium ions. As examples of the positive active material, transition metal oxides, transition metal sulfides, lithium-transition metal composite oxides, lithium-containing polyanion-metal composite compounds and the like are named. The positive active material layer may further contain a conduction promoting agent, a binder, and the like.

The negative electrode is an electrode plate where a negative active material layer is formed on a surface of a negative electrode substrate having an elongated strip shape that is made of copper, a copper alloy or the like, for example. The negative active material layer includes a negative active material. The negative active material contains a silicon (Si)-based material. As the Si-based material, for example, an Si single body $SiO_x$, Si alloy, and the like are named. Amongst these materials, $SiO_x$ is preferable. The negative active material may be formed of only an Si based material, or may be formed of a mixed material of an Si-based material and other materials capable of occluding and releasing lithium ions. As other negative active materials used by being mixed with an Si-based material, for example, carbon-based materials such as graphite, hard carbon, soft carbon and the like are named. The negative active material layer may further contain a binder, a thickener and the like.

As an electrolyte sealed in the case 21, an electrolyte substantially equal to an electrolyte used in a conventional lithium ion secondary battery can be used. For example, as the electrolyte, an electrolyte that contains a support salt in an organic solvent can be used. As the organic solvent, for example, non-proton solvent such as a carbonate group, an ester group, an ether group or the like can be used. As the support salt, for example, a lithium salt such as $LiPF_6$, $LiBF_4$, $LiClO_4$ can be preferably used. The electrolyte may contain, for example, various additives such as a gas generating agent, a film forming agent, a dispersion agent, and a thickener.

In FIG. 1, as an example of the energy storage device 2, the angular-type lithium ion secondary battery that includes a winding-type electrode assembly has been described. Alternatively, the energy storage device 2 may be a cylindrical lithium ion battery. The energy storage device 2 may be a lithium ion battery that includes a stacked electrode assembly, or may be a laminate type (a pouch type) lithium ion battery or the like. Further, the energy storage device 2 may be a whole solid lithium ion battery that uses a solid electrolyte.

Figure 2:
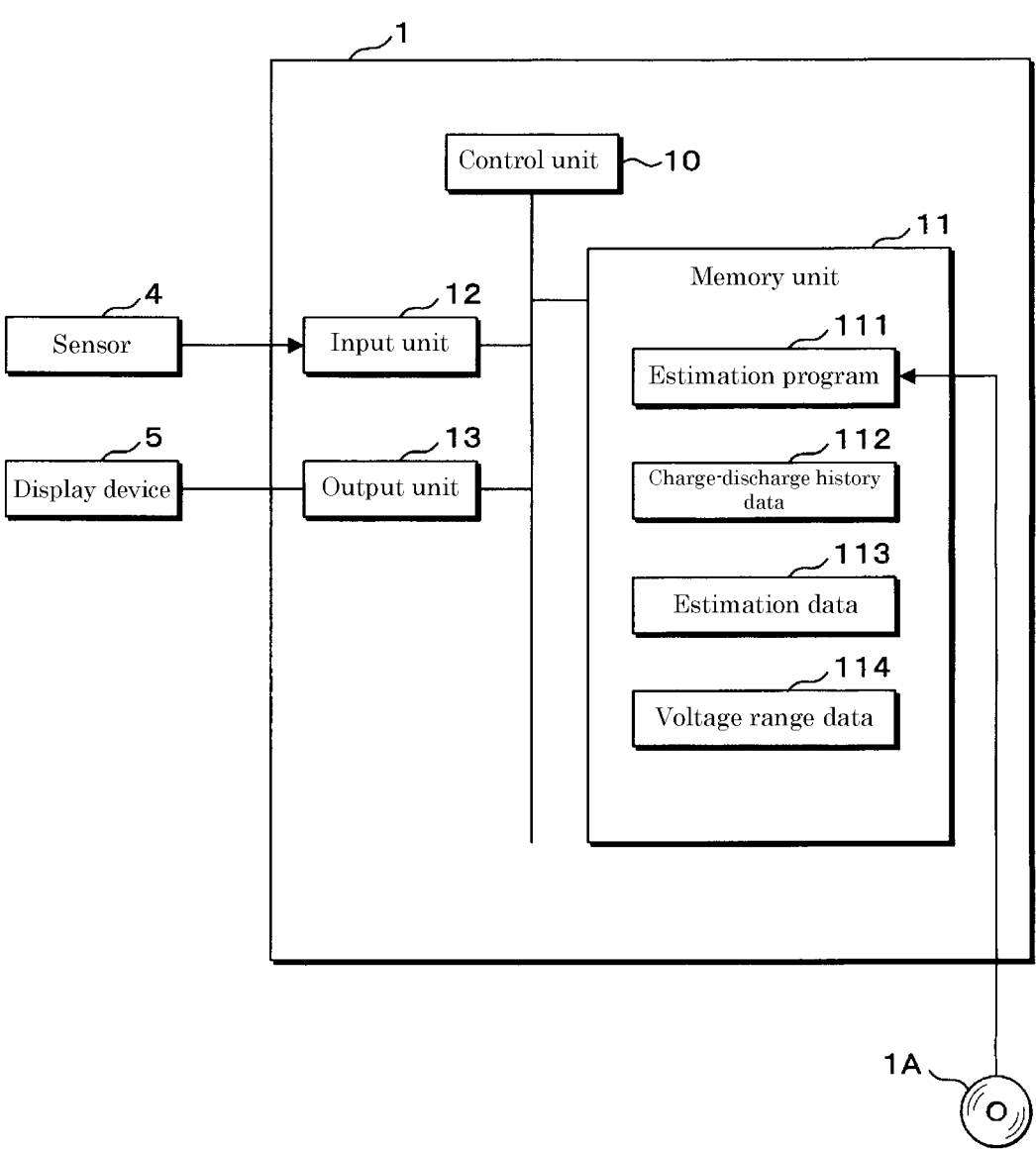
FIG. 2 is a block diagram of the estimation device.

FIG. 2 is a block diagram of the estimation device 1. The estimation device 1 includes a control unit 10, a memory unit 11, an input unit 12, and an output unit 13.

The control unit 10 is an arithmetic operation circuit that includes a central processing unit (CPU), a read only memory (ROM), a random access memory (RAM) and the like. The CPU that the control unit 10 includes executes various computer programs stored in the ROM and the memory unit 11, and makes the entire device function as the estimation device of the present disclosure by controlling the operations of the respective hardware described above. The control unit 10 may include functions of: a timer that counts an elapsed time from a point of time that a measurement start command is given to a point of time that a measurement finishing command is given; a counter that counts the number, a clock that outputs information on date and time and the like.

The memory unit 11 is a memory device such as a flash memory. Various computer programs and data are stored in the memory unit 11. The memory unit 11 stores an estimation program 111 for estimating states of the energy storage devices 2, charge-discharge history data 112, estimation data 113, voltage range data 114, and the like.

The estimation program 111 is provided by a non-transitory recording medium 1A that is stored in the computer program in a readable manner, for example. The recording medium 1A is a portable memory such as a CD-ROM, a USB memory, or a secure digital (SD) card or the like. The control unit 10 reads a desired a computer program from the recording medium 1A using a reading device not illustrated in the drawing, and makes the memory unit 11 store the read computer program. Alternatively, the computer program described above may be provided through communication.

The charge-discharge history data 112, the estimation data 113, and the voltage range data 114 store information used in the estimation processing of SOCs of the energy storage devices 2. Although described in detail later, in the estimation of SOC, the control unit 10 selectively performs either one of a first estimation method that uses a charge state-voltage profile (SOC-OCV curve) indicating the relationship between a charge state and a voltage of the energy storage device 2, and a second estimation method that uses an integrated value of a charge-discharge current of the energy storage device 2. The control unit 10 decides which estimation method is to be performed out of the first estimation method and the second estimation method based on the charge-discharge history of the energy storage device 2. More specifically, the control unit 10 decides which estimation method is to be performed out of the first estimation method and the second estimation method based on a voltage range at the time of charging or discharging the energy storage device 2. The control unit 10 estimates the SOC of the energy storage device 2 by performing the first estimation method or the second estimation method using the above-mentioned respective data.

In the charge-discharge history data 112, information indicating the charge-discharge history (operation history) of the energy storage device 2 is stored. The charge-discharge history data 112 includes, for example, information indicating a period (use period) during which the energy storage device 2 performed charge or discharge, information relating to charge or discharge that the energy storage device 2 performed during use period, and the like. The information indicating the use period of the energy storage device 2 is information that includes information indicating points of time at which charge or discharge started or finished, a cumulative use period during which the energy storage device 2 was used and the like. Information relating to charge or discharge that the energy storage device 2 performed is information indicating a voltage, a rate, a temperature and the like in a time period during which the energy storage device 2 performed charge or in a time period during which the energy storage device 2 is performed discharge. The control unit 10 acquires detection values such as a current value, a voltage value, a temperature of the energy storage device 2, and stores information based on the acquired detection values in the charge-discharge history data 112. In this manner, the charge-discharge history that includes the elapsed time data of the detection values of the energy storage device 2 is accumulated.

The SOC-OCV curve corresponding to the energy storage device 2 is stored in the estimation data 113. The SOC-OCV curve may be updated at predetermined time intervals by taking into account the deterioration of the energy storage device 2. The control unit 10 acquires the SOC-OCV curve in advance by communicating with an external device (not illustrated), for example, and stores the acquired SOC-OCV curve in the estimation data 113.

The information on a voltage range where the first estimation method can be performed is stored in the voltage range data 114. The voltage range where the first estimation method can be performed is a voltage range where a transient potential change described later is not generated. For example, an upper limit value and a lower limit value that define a voltage range may be stored in the voltage range data 114. Alternatively, in the voltage range data 114, information relating to a voltage range where the first estimation method cannot be performed, that is, a voltage range where a transient potential change that is described later is generated may be stored. The control unit 10 acquires a voltage range that corresponds to the composition of the negative electrode of the energy storage device 2 in advance by communicating with an external device (not illustrated), for example, and stores the acquired voltage range in the voltage range data 114. In the voltage range data 114, a deep discharge threshold serving as a factor for determining whether or not to perform the first estimation method and information relating to the second region of the SOC-OCV curve may be stored. The deep discharge threshold and the second region will be described in detail in other embodiments.

The input unit 12 includes an interface for connecting the sensor 4 to the input unit 12. The input unit 12 may include an A/D converter that converts an analog signal received from the sensor 4 into a digital signal. The sensor 4 includes, for example, a current sensor and a voltage sensor. The current sensor is an existing sensor such as a current transformer or a Hall effect current sensor, and measures a current flowing into the energy storage device 2 and/or flowing out from the energy storage device 2 in time series. The voltage sensor is an existing voltage sensor, and measures a voltage across the energy storage device 2 in time series. The input unit 12 receives a signal relating to a current measured by the current sensor and a signal relating to a voltage measured by the voltage sensor. The control unit 10 acquires a current value and a voltage value as needed through the input unit 12. The sensor 4 may include a temperature sensor such as a thermocouple or a thermistor. The temperature sensor measures a temperature of the energy storage device 2 in time series. The control unit 10 acquires temperature data of the energy storage device 2 or temperature data of the energy storage apparatus 100 measured by the temperature sensor through the input unit 12 as needed.

The output unit 13 includes a connecting interface for connecting the display device 5 to the output unit 13. An example of the display device 5 is a liquid crystal display device. In a case where the control unit 10 acquires the result of estimation relating to the charge state of the energy storage device 2, the control unit 10 outputs information based on the result of estimation from the output unit 13 to the display device 5. The display device 5 displays the result of estimation based on the information outputted from the output unit 13.

Alternatively, the output unit 13 may include a communication interface that communicates with an external device. The external device that is communicably connected to the output unit 13 is a terminal device such as a personal computer, a smartphone or the like used by a user, an administrator, or the like. In a case where the control unit 10 acquires the result of estimation relating to the charge state of the energy storage device 2, the control unit 10 outputs information based on the result of estimation from the output unit 13 to the terminal device. The terminal device receives the information transmitted from the output unit 13, and displays the result of the result of estimation on a display of the own device based on the received information. The estimation device 1 may include a notification unit such as an LED lamp or a buzzer in order to notify the user of the result of estimation of a charge state of the energy storage device 2.

Here, the characteristics of the energy storage device (hereinafter, also referred to as the battery) 2 that include the negative electrode having a negative active material that contains a Si-based material are described in detail.

As the result of the extensive studies, the inventors of the present invention have found out that, with respect to the battery 2 having a negative active material that contains a Si-based material, in a case where the battery 2 is charged or discharged under a specific condition (for example, a specific voltage range), a transient potential change is generated in the negative electrode. The transient potential change is a phenomenon where the charge-discharge characteristic of the battery 2 is changed by performing charge or discharge under a specific condition, and a capacity (a capacity retention ratio) of the battery 2 is temporarily lowered due to such a change in the charge-discharge characteristic of the battery 2. In the present specification, the capacity retention ratio means a ratio of a battery capacity at a certain point of time to an initial battery capacity. The above-mentioned processing is specifically described hereinafter.

Figure 3:
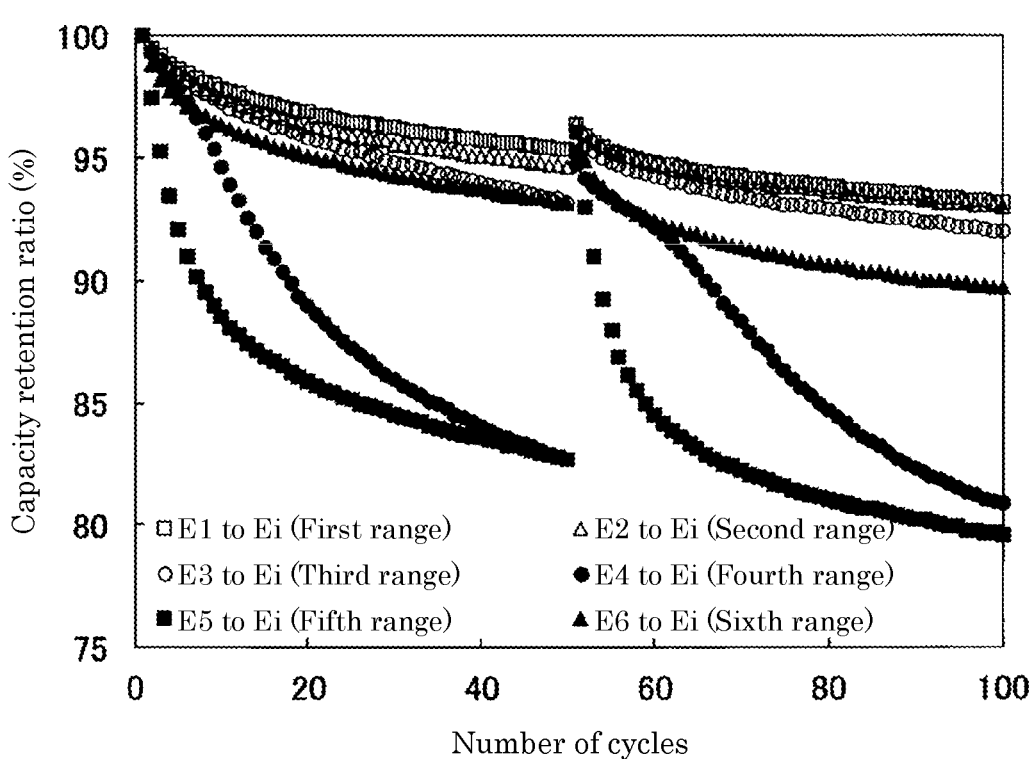
FIG. 3 is a graph illustrating a relationship between the number of cycles and a capacity retention ratio in a Si-Gr mixed battery for each voltage range.

With respect to a battery where a negative active material is made of a mixture of 20 mass % of SiO and 80 mass % of Gr (hereinafter, the battery being also referred to as a Si-Gr mixed battery) 2, the battery was subjected to a charge-discharge cycle test in a plurality of voltage ranges each defined by an upper limit voltage value and a lower limit voltage value described later. FIG. 3 is a graph illustrating a relationship between the number of cycles and a capacity retention ratio in a Si-Gr mixed battery in respective voltage ranges. In FIG. 3, the number of cycles is taken on an axis of abscissas, and a capacity retention ratio (%) is taken on an axis of ordinates. During the test, a capacity confirmation test was performed after the charge and discharge were repeated 50 cycles and, then, the charge and discharge were repeated again until 100 cycles.

A plurality of thresholds were provided from a full-charge voltage Ei to an end-of-discharge voltage E0 of the battery 2. The charge and discharge were repeatedly performed with respect to a plurality of limited voltage ranges where the full-charge voltage Ei was set as an upper limit and the above-mentioned plurality of thresholds were set as lower limits. In the example illustrated in FIG. 3, six voltage ranges consisting of: a first range from the voltage E1 to the voltage Ei, a second range from the voltage E2 to the voltage Ei, a third range from the voltage E3 to the voltage Ei, a fourth range from the voltage E4 to the voltage Ei, a fifth range from the voltage E5 to the voltage Ei, and a sixth range from the voltage E6 to the voltage Ei were set. Here, $E0<E1<E2<E3<E4<E5<E6<Ei$ is satisfied.

As illustrated in FIG. 3, in the specific voltage ranges, the capacity retention ratio was largely decreased as the number of cycles was increased. In the example illustrated in FIG. 3, when charge and discharge were repeatedly performed in the fifth range and the fourth range, the capacity retention ratio was significantly decreased. The decrease in the capacity retention ratio was once eliminated by performing the capacity confirmation test in which deep discharge was performed over a range from the full charge voltage Ei to the end-of-discharge voltage E0.

Figure 4:
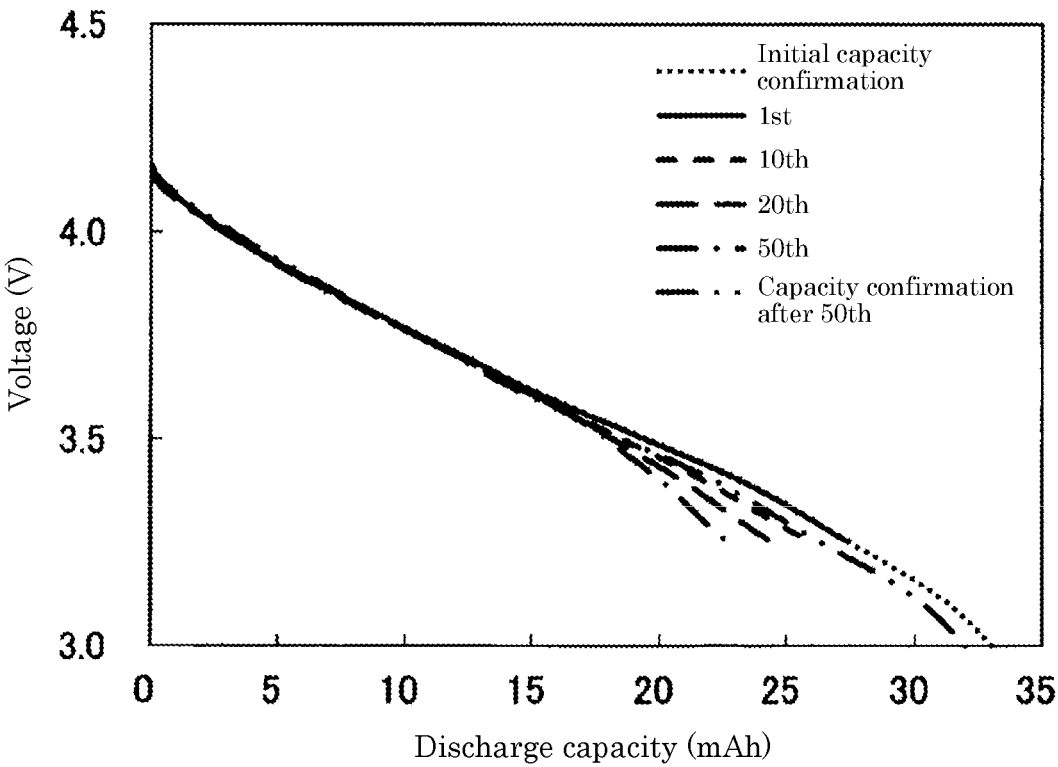
FIG. 4 is a graph illustrating a discharge capacity-voltage correlation in a Si-Gr mixed battery for each cycle.

FIG. 4 is a graph illustrating a discharge capacity-voltage correlation in a Si-Gr mixed battery for each cycle. In FIG. 4, the discharge capacity (mAh) is taken on an axis of abscissas, and a voltage (V) is taken on an axis of ordinates. FIG. 4 illustrates, in the cycle test in the fourth range described above, the discharge characteristic at the time of initial capacity confirmation, the discharge characteristic at the time of capacity confirmation after the 1st cycle, the discharge characteristic at the time of capacity confirmation after the 10th cycle, the discharge characteristic at the time of capacity confirmation after the 20th cycle, the discharge characteristic at the time of capacity confirmation after the 50th cycle, and the discharge characteristic at the time of capacity confirmation after the 50th cycle. The term "at the time of capacity confirmation after the 50th cycle" is "at the time of capacity confirmation after deep discharge is performed after the 50th cycle (when the transient potential change being generated). As can be clearly understood from FIG. 4, a change in the curve shape (profile) is increased along with the increase of the number of cycles, and a state is brought about where the end of discharge is shifted to the left along the axis of abscissas. The curve shape is hardly changed in a region where the voltage was approximately 3.5 V or more, and is largely changed in a region from a voltage of less than approximately 3.5 V to the end of discharge. Further, since the curve shape at the time of capacity confirmation after the 50th cycles approached to the curve shape at the time of initial capacity confirmation.

Accordingly, it was found that a change in the curve shape can be eliminated by performing the deep discharge. The rated capacity at the time of capacity confirmation after the 50th cycles is hardly changed from the rated capacity at the time of initial capacity confirmation, and the discharge capacity was recovered through capacity confirmation accompanied by the deep discharge.

Figure 5:
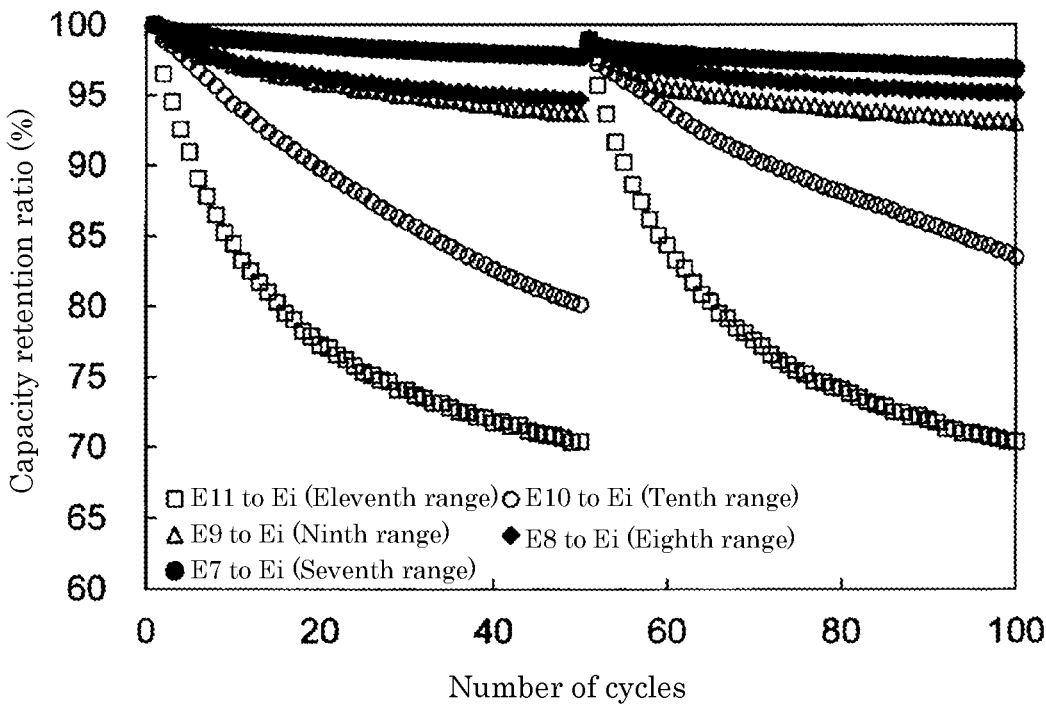
FIG. 5 is a graph illustrating a relationship between the number of cycles and a capacity retention ratio in a Si-based battery for each voltage range.
Figure 6:
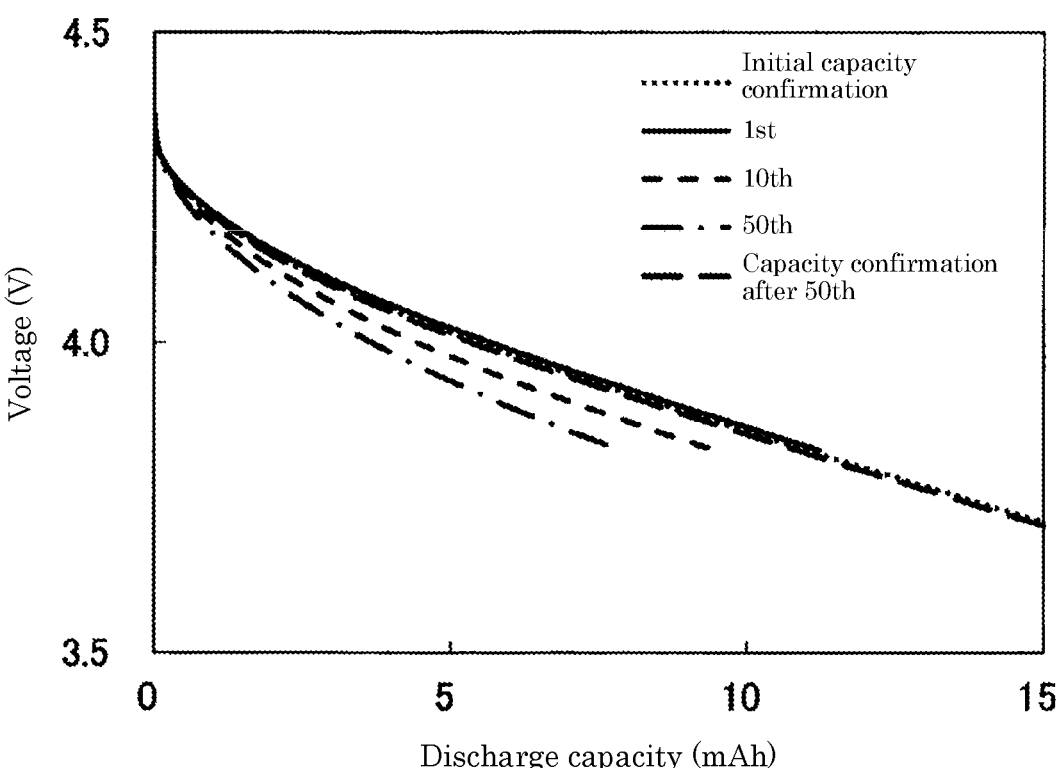
FIG. 6 is a graph illustrating a discharge capacity-voltage correlation in a Si-based battery for each cycle.

The substantially same experiment as described above was performed with respect to a battery in which the composition of the negative active material was SiO (the content of SiO with respect to the negative electrode mixture being 90 mass %) (hereinafter, also referred to as a Si-based battery) 2. In the Si-based battery 2, five voltage ranges (the seventh range to the eleventh range) having the full-charge voltage Ei as an upper limit and five different voltage values (E7 to E11, where E7<E8<E9<E10<E11 is satisfied.) as the lower limits were set. A charge-discharge cycle test was performed with respect to these five voltage ranges. FIG. 5 is a graph illustrating a relationship between the number of cycles and a capacity retention ratio in a Si-based battery for respective voltage ranges. FIG. 6 is a graph illustrating a discharge capacity-voltage correlation in a Si-based battery for respective cycles. FIG. 6 illustrates, in the eleventh range from the voltage E11 to the voltage Ei, the discharge characteristic at the time of initial capacity confirmation, the discharge characteristic at the time of capacity confirmation at the 1st cycle, the discharge characteristic at the time of capacity confirmation at the 10th cycle, the discharge characteristic at the time of capacity confirmation at the 50th cycle, and the discharge characteristic at the time of capacity confirmation after the 50th cycle.

As illustrated in FIG. 5, also in the Si-based battery 2, with respect to the specified voltage ranges, the capacity retention ratio was largely decreased as the number of cycles was increased. However, unlike the Si-Gr mixed battery 2, when the voltage is limited to a high voltage range (for example, the 11th range and the 10th range), the decrease of the capacity retention ratio is conspicuous. As can be clearly understood from FIG. 6, also in the Si-based battery 2, a change in the curve shape (profile) is increased along with the increase of the number of cycles, and a state is brought about where the end of discharge is shifted to the left along the axis of abscissas. The curve shape at the time of capacity confirmation after the 50th cycle and the curve shape at the time of initial capacity confirmation were substantially equal, and a change in curve shape was eliminated by performing deep discharge. However, unlike the Si-Gr mixed battery 2, the deviation of the curve shape occurred in a region that includes almost all voltages from the start of discharge to the end of discharge.

Figure 7:
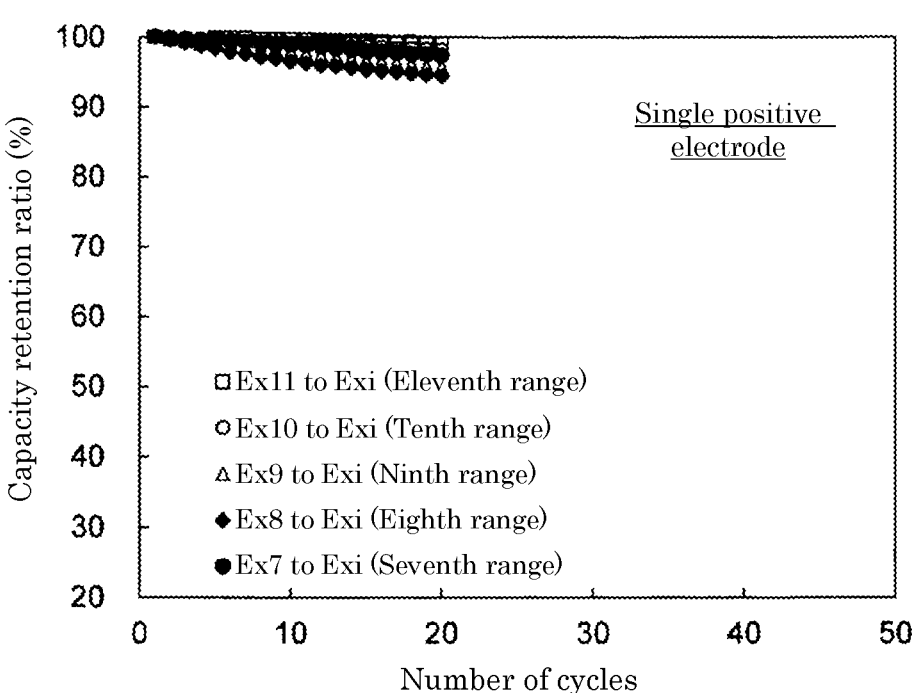
FIG. 7 is a graph illustrating a relationship between the number of cycles and a capacity retention ratio at a single positive electrode and a single negative electrode.
Figure 7:
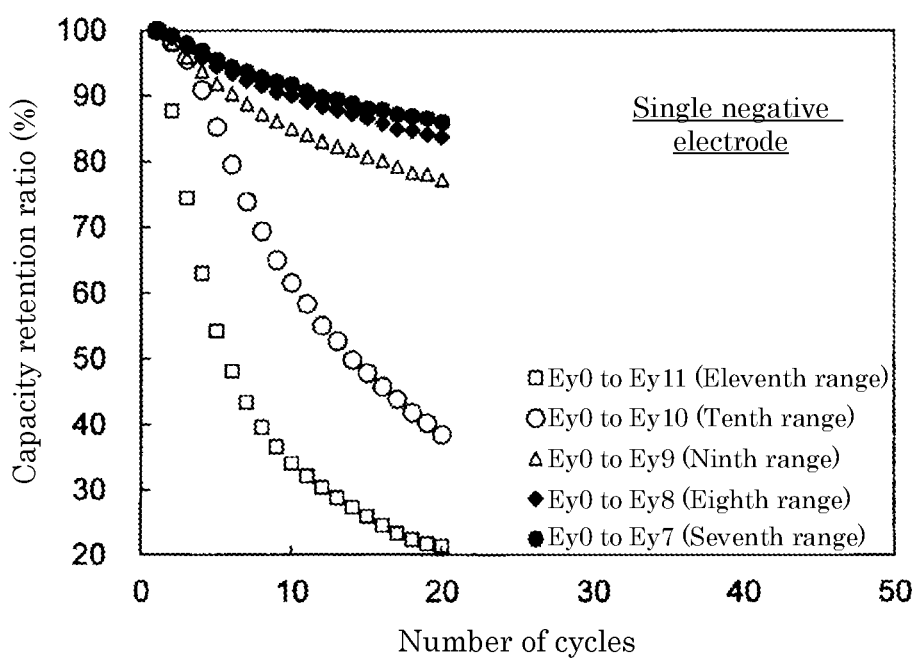

In order to separate the contribution in a transient potential change between the single positive electrode and the single negative electrode, for each of the positive electrode and the negative electrode, a half battery (half cell) for analysis where a counter electrode is made of lithium was prepared, and a capacity retention ratio was measured. FIG. 7 is a graph illustrating a relationship between the number of cycles and a capacity retention ratio at a single positive electrode and a single negative electrode respectively. In FIG. 7, the number of cycles is taken on an axis of abscissas, and a capacity retention ratio (%) is taken on an axis of ordinates. The composition of the single positive electrode and the composition of the single negative electrode and the five voltage ranges were set in conformity with a composition and a voltage range (SOC range corresponding to the voltage) of a full cell of the Si-based battery 2 in the cycle test illustrated in FIG. 5.

As illustrated in an upper side of FIG. 7, in the single positive electrode, the capacity retention ratio was hardly decreased in any voltage range. As illustrated in a lower side of FIG. 7, in the single negative electrode, also with respect to the specified ranges, the capacity retention ratio was largely decreased as the number of cycles was increased. From this result, it is confirmed that, in the Si-based battery 2, a transient potential change generated by repeating a charge-discharge cycle in a specific voltage range is generated by the negative electrode.

Although the generation mechanism of a transient potential change in the battery 2 having a negative active material that contains an Si-based material has not yet been sufficiently clarified, it is estimated that the transient potential change is generated by the formation of a crystal layer that contains an $Li_xSi$ alloy on a surface of a negative electrode. That is, Li ions are not uniformly occluded in a Si crystal, but enter the inside of the Si crystal while forming a $Li_xSi$ alloy around the Si crystals. The $Li_xSi$ alloy has a plateau potential at which the charge-discharge potential hardly changes, and it is estimated that this plateau potential affects a potential change of the negative electrode when the charge and the discharge are repeated in a specific voltage range.

There is a case where an extremely small amount of transient potential change is generated even in the positive electrode. However, this potential change is eliminated by allowing a sufficient time for charge and discharge, and does not depend on a voltage range at the time of discharge. A reaction of lithium ions in a positive electrode firstly proceeds under a kinetic control. A reaction rate at this stage changes depending on a reaction condition (for example, a voltage range) during discharge and hence, the degree of a potential change at the time of reaction differs and the difference appears as a transient capacity change. However, after the lapse of a sufficient reaction time, a reaction based on a thermodynamic control proceeds after a kinetic control, and finally the transient capacity change converges to the energy of a product in the positive electrode. Accordingly, the potential change is eliminated.

To summarize the above phenomenon, in the battery 2 having a negative active material that contains a Si-based material, a charge-discharge characteristic of the battery 2 is changed by repeating the charge and the discharge in a specific voltage range. Along with such a change in a charge-discharge characteristic, a transient potential change where the capacity of the battery 2 is lowered is generated. This transient potential change is eliminated by performing discharge that exceeds a predetermined deep discharge threshold (deep discharge). The voltage range where the transient potential change is generated varies depending on the content (composition of the negative electrode) of the Si-based material in the negative active material. As described hereinafter, the estimation device 1 specifies a voltage range during charge and discharge of the battery 2, and performs a first estimation method using an SOC-OCV curve when the voltage range is a voltage range where a transient potential change is not generated. That is, the SOC reset is performed in the voltage range in which a transient potential change is not generated. In a case where the voltage range is not a voltage range where a transient potential change is not generated, the second estimation method by current integration is performed. With such processing, it is possible to accurately estimate a charge state of the battery 2 having a negative active material that contains an Si-based material.

Figure 8:
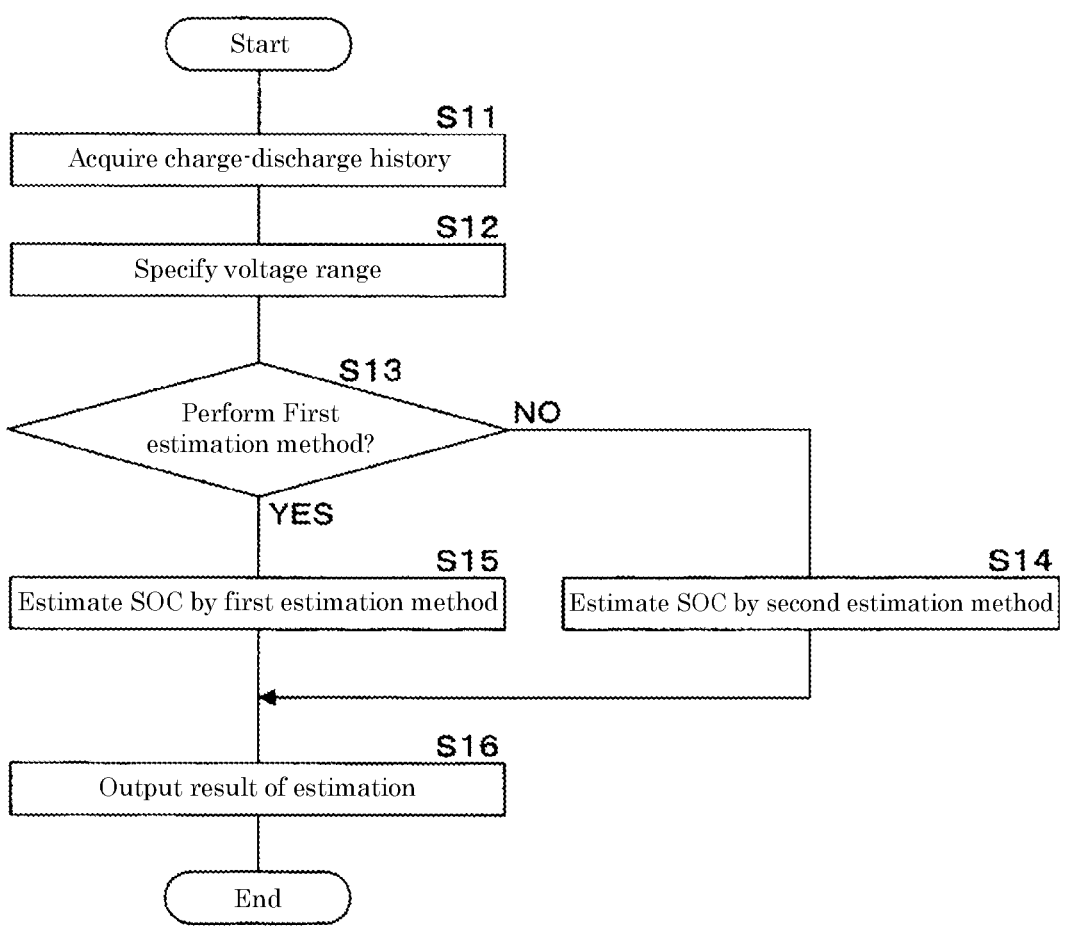
FIG. 8 is a flowchart illustrating an example of steps of estimation processing.

FIG. 8 is a flowchart illustrating an example of steps of estimation processing. The control unit 10 of the estimation device 1 performs the following processing in accordance with an estimation program 111.

The control unit 10 of the estimation device 1 acquires a charge-discharge history by acquiring detection values such as a current value, a voltage value, a temperature or the like of the battery 2 via the input unit 12 (step S11). When the estimation device 1 is installed at a remote place, the control unit 10 receives a detection value of the energy storage device 2 by communication via the output unit 13. The control unit 10 stores the acquired charge-discharge history in the charge-discharge history data 112 in the memory unit 11.

The control unit 10 specifies a voltage range relating to the use of the battery 2 based on the acquired charge-discharge history (step S12). The control unit 10 determines whether or not to perform the first estimation method by estimating whether or not a transient potential change of the negative electrode is generated based on the specified voltage range (step S13). More specifically, the control unit 10 determines whether or not the voltage range where the first estimation method can be performed matches the specified voltage range based on the information stored in the voltage range data 114. The control unit 10 determines whether or not to perform the first estimation method according to the result of determination. The first estimation method is an OCV method (see voltage) for determining an SOC based on an SOC-OCV curve. The voltage range where the first estimation method can be performed is a voltage range where a transient potential change in the negative electrode is not generated.

When the charge-discharge history of the battery 2 does not correspond to the voltage range where the first estimation method can be performed, it is estimated that a transient potential change is generated in the negative electrode of the battery 2. In this case, there is a high possibility that the SOC-OCV curve is not uniquely determined and hence, and there is a high possibility that the estimation accuracy by the first estimation method is decreased. On the other hand, in a case where the charge-discharge history of the battery 2 corresponds to the voltage range where the first estimation method can be performed, it is estimated that a transient potential change is not generated in the negative electrode of the battery 2. In this case, the SOC-OCV curve is uniquely determined, the SOC can be estimated favorably by the first estimation method.

In a case where the control unit 10 determines not to perform the first estimation method because the voltage range where the first estimation method can be performed does not match the specified voltage range (step S13: NO), the control unit 10 performs the second estimation method so as to estimate the SOC (step S14). The second estimation method is a current integration method for determining the SOC using an integrated value of a current flowing through the battery 2.

As an arithmetic expression of a current integration method, for example, the following expression (1) may be used.

$$SOC_i = SOC_{i-1} + I_i \times \Delta t_i / Q \times 100 \tag{1}$$

$SOC_i$ is a SOC of a present time, $SOC_{i-1}$ is a SOC of a previous time, $I_i$ is a current value, $\Delta t_i$ is a time interval, and Q is a full charge capacity.

In a case where the control unit 10 determines to perform the first estimation method because the voltage range where the first estimation method can be performed matches the specified voltage range (step S13: YES), the control unit 10 performs the first estimation method so as to estimate the SOC (step S15). The control unit 10 reads, based on the SOC-OCV curve stored in the estimation data 113, the SOC corresponding to a voltage value acquired in step S11 on the SOC-OCV curve.

The control unit 10 outputs information based on the result of estimation of an SOC to the display device 5 or the like (step S16), and finishes the series of processing.

In the processing described above, the control unit 10 may estimate an SOC every time at a point of time that the control unit 10 acquires a detection value from the input unit 12. Alternatively, the control unit 10 may estimate an SOC at respective point of time by sequentially reading the measurement data from the memory unit 11 after detection values for a certain period are stored in the memory unit 11.

In the processing described above, the control unit 10 determines whether or not to perform the first estimation method based on whether or not the charge-discharge history of the battery 2 corresponds to a voltage range where the first estimation method can be performed. Alternatively, the control unit 10 may determine whether or not to perform the first estimation method based on whether or not the charge-discharge history of the battery 2 corresponds to a voltage range where the first estimation method cannot be performed.

According to the present embodiment, a charge state of the battery 2 including a negative active material that contains an Si-based material can be accurately estimated based on a characteristic of the Si-based material. The estimation device 1 estimates a charge state by the first estimation method using an SOC-OCV curve in a voltage range where a transient potential change is not generated in the negative electrode. In a voltage range where a transient potential change is generated in the negative electrode, a charge state is calculated by the second estimation method that performs the current integration. The estimation device 1 controls a timing at which the first estimation method is performed in accordance with the result of the estimation of a generation state of a transient potential change in the negative electrode and hence, the decrease in estimation accuracy of the charge state can be reduced.

Second Embodiment

In the second embodiment, an example is described where the first estimation method is performed when the discharge that exceeds a deep discharge threshold is performed in the battery 2. As described above, a transient potential change at the negative electrode of the energy storage device is eliminated by performing the deep discharge. Deep discharge means the discharge that exceeds a deep discharge threshold. The control unit 10 acquires in advance the information relating to a deep discharge threshold corresponding to the composition of battery 2, and stores the information in the estimation data 113.

When the control unit 10 of the estimation device 1 determines whether or not to perform the first estimation method in step S13 illustrated in FIG. 5, the control unit 10 determines whether or not to perform the first estimation method based on whether or not the discharge that exceeds a deep discharge threshold is performed in the battery 2. More specifically, the control unit 10 determines whether a voltage value acquired in step S11 is less than a deep discharge threshold based on the information stored in the voltage range data 114.

When the voltage value of the battery 2 is less than the deep discharge threshold, that is, when deep discharge is performed, the control unit 10 determines to perform the first estimation method. The control unit 10 reads, based on the SOC-OCV curve stored in the estimation data 113, the SOC corresponding to a voltage value acquired in step S11 on the SOC-OCV curve.

When a voltage value of the battery 2 is more than or equal to a deep discharge threshold, that is, when the deep discharge is not performed, the control unit 10 determines not to perform the first estimation method. The control unit 10 performs the second estimation method and estimates an SOC by current integration.

According to the present embodiment, the control unit 10 performs the first estimation method at a timing that it is estimated that a transient potential change has been eliminated using a deep discharge threshold determined according to the composition of the negative electrode. Accordingly, a charge state of the battery 2 can be accurately estimated.

Third Embodiment

In the third embodiment, an example is described where a more detailed curve shape is taken into consideration in the first estimation method.

Figure 9:
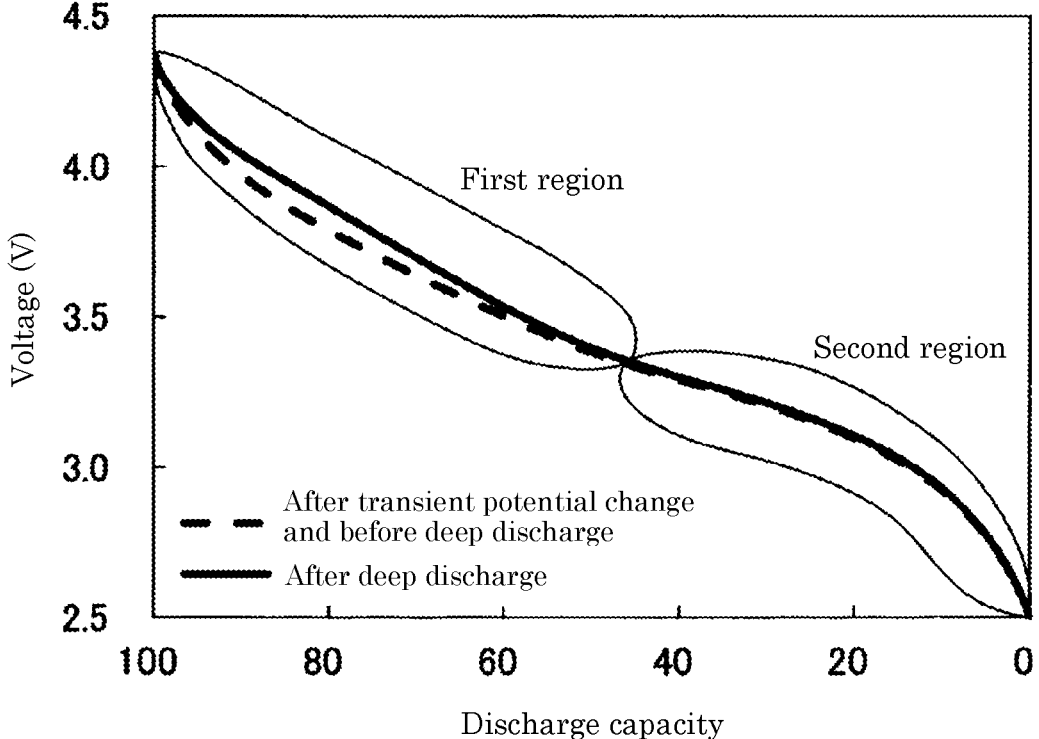
FIG. 9 is a graph illustrating a discharge capacity-voltage correlation before deep discharge and after deep discharge in a Si-based battery.

FIG. 9 is a graph illustrating a discharge capacity-voltage correlation before the deep discharge and after the deep discharge in a Si-based battery 2. In FIG. 9, a discharge capacity is taken on an axis of abscissas, and a voltage (V) is taken on an axis of ordinates. The discharge capacity is a value obtained by normalization using a discharge capacity corresponding to a discharge starting voltage, and corresponds to a charge state. That is, the graph illustrated in FIG. 9 indicates a charge state-voltage profile of an Si-based battery. An estimation method according to the third embodiment is described with reference to FIG. 9.

FIG. 9 shows the result of a capacity confirmation test after performing a cycle test of 100 cycles in the 11th range from the voltage E11 to the voltage Ei described with reference to FIG. 5 using the same Si-based battery 2 as in the first embodiment. In FIG. 9, a broken line indicates a discharge curve at the time of capacity confirmation performed without performing remaining discharge after 100 cycles. That is, the broken line in FIG. 9 indicates a discharge curve at the time of capacity confirmation performed after the generation of a transient potential change and before the deep discharge. In FIG. 9, a solid line indicates a discharge curve when a charge-discharge cycle is performed again over the entire voltage range from a full charge voltage to an end-of-discharge voltage after the capacity confirmation described above. That is, the solid line in FIG. 9 indicates a discharge curve at the time of capacity confirmation performed after the generation of a transient potential change and before the deep discharge.

As illustrated in FIG. 9, the discharge curve before the deep discharge has: a first region where a curve shape is changed compared to the discharge curve after the deep discharge (a deviation in the curve shape being large); and a second region where the curve shape is hardly changed compared to the discharge curve after the deep discharge (the deviation in the curve shape being reduced). That is, with respect to the discharge curve in a case where a transient potential change is generated, there exist the first region where the curve shape is changed due to the transient potential change as compared with the discharge curve in a case where the transient potential change is not generated (is eliminated), and the second region where the curve shape is hardly changed as compared with the discharge curve in the case where the transient potential change is not generated (is eliminated). In the example illustrated in FIG. 9, a region from the starting of discharge to a voltage of approximately 3.3 V or more corresponds to the first region, and a region from a voltage of less than approximately 3.3 V to an end-of-discharge voltage corresponds to the second region. When a voltage of the battery 2 is in the second region, there is almost no change in the curve shape due to a transient potential change and hence, the voltage is uniquely specified by the SOC-OCV curve. The control unit 10 of the estimation device 1 does not perform the first estimation method when an acquired voltage is in the first region, and performs the first estimation method when the acquired voltage is in the second region.

An upper limit value and a lower limit value of the first region and an upper limit value and a lower limit value of the second region differ corresponding to the composition of the negative electrode (the content of Si in the negative active material). For example, in the Si-Gr mixed battery 2 illustrated in FIG. 4 of the first embodiment, there is almost no deviation in the curve shape at a voltage of approximately 3.6 V or more, and the curve shape is largely changed at a voltage of less than approximately 3.6 V. That is, in the Si-Gr mixed battery 2, a region that includes a high voltage corresponds to the second region, and a region that includes a low voltage corresponds to the first region. The control unit 10 acquires in advance the information relating to an upper limit value and a lower limit value of the second region that correspond to the composition of battery 2, and stores the information in the voltage range data 114.

When the control unit 10 of the estimation device 1 determines whether or not to perform the first estimation method in step S13 illustrated in FIG. 5, the control unit 10 determines whether or not to perform the first estimation method based on whether or not a voltage value acquired in step S11 is within the second region. More specifically, the control unit 10 determines whether a voltage value acquired in step S11 is in a region between an upper limit value and a lower limit value of the second region based on the information stored in the voltage range data 114.

When the control unit 10 determines that the voltage value is in the second region, the control unit 10 determines to perform the first estimation method. The control unit 10 reads, based on an SOC-OCV curve stored in the estimation data 113, an SOC that corresponds to a voltage value acquired in step S11 in the second region of the SOC-OCV curve.

When the control unit 10 determines that the voltage value is not in the second region, the control unit 10 determines not to perform the first estimation method. The control unit 10 performs the second estimation method and estimates an SOC by current integration.

The control unit 10 may comprehensively determine whether or not to perform the first estimation method by determining whether or not the charge-discharge history of the battery 2 corresponds to a voltage range where the first estimation method can be performed in addition to the determination whether or not the above-mentioned voltage value is in the second region.

According to the present embodiment, a charge state of the battery 2 can be accurately estimated by identifying the voltage at which the first estimation method can be performed based on the more detailed charge-discharge characteristic corresponding to the composition of the negative electrode.

It should be construed that the embodiments disclosed herein are illustrative in all respects and are not limitative. The technical features described in the embodiments can be combined with each other, and the scope of the present invention is intended to include all modifications within the scope of the claims and the scope equivalent to the claims.

The invention claimed is:

1. An estimation device for estimating a charge state of an energy storage device that includes a negative electrode having a negative active material that contains Si, the estimation device comprising:
 a control unit that is configured to determine based on a charge-discharge history of the energy storage device whether or not to perform a first estimation method of estimating the charge state of the energy storage device by using a relationship between the charge state and a voltage of the energy storage device,
 wherein the control unit is configured to determine whether or not to perform the first estimation method in accordance with a result of estimation relating to a transient potential change of the negative electrode.

2. The estimation device according to claim 1, wherein the control unit is configured to determine to perform the first estimation method in a case where the voltage of the energy storage device is within a range of a voltage threshold where the transient potential change of the negative electrode corresponding to a content of Si in the negative active material is not generated.

3. The estimation device according to claim 1, wherein the control unit is configured to determine to perform the first estimation method in a case where discharge that exceeds a deep discharge threshold corresponding to a content of Si in the negative active material is performed in the energy storage device.

4. The estimation device according to claim 1, wherein
 a charge state-voltage profile indicating a relationship between a charge state and the voltage of the energy storage device includes: a first region where a shape of the charge state-voltage profile changes due to the transient potential change of the negative electrode and a second region where the shape of the charge state-voltage profile does not change, and
 the control unit is configured to estimate the charge state using the charge-state voltage profile in the second region.

5. The estimation device according to claim 1, wherein in a case where the control unit determines not to perform the first estimation method, the control unit is configured to perform a second estimation method for estimating the charge state of the energy storage device using an integrated value of a current flowing into the energy storage device and/or flowing out from the energy storage device.

6. An energy storage module comprising:
 an energy storage device; and
 the estimation device according to claim 1.

7. A method for estimating a charge state of an energy storage device that includes a negative electrode having a negative active material that contains Si, the method comprising:
 determining based on a charge-discharge history of the energy storage device whether or not to perform a first estimation method of estimating the charge state of the energy storage device by using a relationship between the charge state and a voltage of the energy storage device; and
 determining whether or not to perform the first estimation method in accordance with a result of estimation relating to a transient potential change of the negative electrode.

8. The method according to claim 7, further comprising determining to perform the first estimation method in a case where the voltage of the energy storage device is within a range of a voltage threshold where the transient potential change of the negative electrode corresponding to a content of Si in the negative active material is not generated.

9. The method according to claim 7, further comprising determining to perform the first estimation method in a case where discharge that exceeds a deep discharge threshold corresponding to a content of Si in the negative active material is performed in the energy storage device.

10. The method according to claim 7, wherein a charge state-voltage profile indicating a relationship between a charge state and the voltage of the energy storage device includes: a first region where a shape of the charge state-voltage profile changes due to the transient potential change of the negative electrode and a second region where the shape of the charge state-voltage profile does not change, and
 the method further comprises estimating the charge state using the charge-state voltage profile in the second region.

11. The method according to claim 7, wherein in a case where it is determined not to perform the first estimation method, the method comprises performing a second estimation method for estimating the charge state of the energy storage device using an integrated value of a current flowing into the energy storage device and/or flowing out from the energy storage device.

12. A non-transitory computer-readable medium that stores a computer program for causing a computer that estimates a charge state of an energy storage device that includes a negative electrode having a negative active material that contains Si to perform processing when executed on a processor of:
 determining based on a charge-discharge history of the energy storage device whether or not to perform a first estimation method of estimating the charge state of the energy storage device by using a relationship between the charge state and a voltage of the energy storage device; and
 determining whether or not to perform the first estimation method in accordance with a result of estimation relating to a transient potential change of the negative electrode.

13. The non-transitory computer-readable medium according to claim 12, further comprising determining to perform the first estimation method in a case where the voltage of the energy storage device is within a range of a voltage threshold where the transient potential change of the negative electrode corresponding to a content of Si in the negative active material is not generated.

14. The non-transitory computer-readable medium according to claim 12, further comprising determining to perform the first estimation method in a case where discharge that exceeds a deep discharge threshold corresponding to a content of Si in the negative active material is performed in the energy storage device.

15. The non-transitory computer-readable medium according to claim 12, wherein a charge state-voltage profile indicating a relationship between a charge state and the voltage of the energy storage device includes: a first region where a shape of the charge state-voltage profile changes due to the transient potential change of the negative electrode and a second region where the shape of the charge state-voltage profile does not change, and the method further comprises estimating the charge state using the charge-state voltage profile in the second region.

16. The non-transitory computer-readable medium according to claim 12, wherein in a case where it is determined not to perform the first estimation method, the method comprises performing a second estimation method for estimating the charge state of the energy storage device using an integrated value of a current flowing into the energy storage device and/or flowing out from the energy storage device.

* * * * *